(12) United States Patent
Monteen et al.

(10) Patent No.: US 8,336,188 B2
(45) Date of Patent: Dec. 25, 2012

(54) THIN WAFER CHUCK

(75) Inventors: Bjorn Monteen, San Jose, CA (US); Kuan Yong Ho, Singapore (SG)

(73) Assignee: FormFactor, Inc., Livermore, CA (US)

( * ) Notice: Subject to any disclaimer, the term of this patent is extended or adjusted under 35 U.S.C. 154(b) by 1195 days.

(21) Appl. No.: 12/175,359

(22) Filed: Jul. 17, 2008

(65) Prior Publication Data

US 2010/0013169 A1 Jan. 21, 2010

(51) Int. Cl.
*B23Q 7/00* (2006.01)
*B25B 11/00* (2006.01)

(52) U.S. Cl. ............... 29/559; 269/21; 414/941; 279/3

(58) Field of Classification Search ............. 269/21, 269/900; 414/941; 279/3; 355/73; 294/907, 294/902; 901/40; 356/244; 29/559
See application file for complete search history.

(56) References Cited

U.S. PATENT DOCUMENTS

| | | | |
|---|---|---|---|
| 4,131,267 A | 12/1978 | Ono et al. | |
| 4,448,404 A | 5/1984 | Ogawa et al. | |
| 4,466,073 A | 8/1984 | Boyan et al. | |
| 4,721,462 A * | 1/1988 | Collins, Jr. ............ | 432/253 |
| 5,033,538 A * | 7/1991 | Wagner et al. ......... | 165/80.1 |
| 5,048,804 A * | 9/1991 | Ito ......................... | 269/21 |
| 5,177,857 A * | 1/1993 | Ito ......................... | 29/559 |
| 5,180,000 A * | 1/1993 | Wagner et al. ......... | 165/80.1 |
| 5,191,218 A | 3/1993 | Mori et al. | |
| 5,278,494 A | 1/1994 | Obigane | |
| 5,281,297 A * | 1/1994 | Lee ........................ | 156/552 |
| 5,324,012 A | 6/1994 | Aoyama et al. | |
| 5,564,682 A | 10/1996 | Tsuji | |
| 5,707,051 A * | 1/1998 | Tsuji ...................... | 269/21 |
| 5,852,413 A | 12/1998 | Bacchi et al. | |
| 5,857,667 A * | 1/1999 | Lee ........................ | 269/21 |
| 5,932,045 A * | 8/1999 | Campbell et al. ...... | 156/102 |
| 6,032,997 A | 3/2000 | Elliott et al. | |
| 6,156,415 A * | 12/2000 | Campbell et al. ...... | 428/212 |
| 6,164,633 A | 12/2000 | Mulligan et al. | |
| 6,173,648 B1 * | 1/2001 | Misono et al. ......... | 101/474 |
| 6,272,989 B1 * | 8/2001 | Misono et al. ......... | 101/474 |
| 6,446,948 B1 * | 9/2002 | Allen ..................... | 269/21 |
| 6,513,796 B2 * | 2/2003 | Leidy et al. ........... | 269/21 |
| 6,538,733 B2 | 3/2003 | Gaal et al. | |
| 6,597,432 B2 | 7/2003 | Ida | |
| 6,912,915 B2 | 7/2005 | Jian et al. | |
| 7,089,782 B2 | 8/2006 | Lin et al. | |
| 7,104,579 B2 | 9/2006 | Casarotti et al. | |
| 7,112,359 B2 * | 9/2006 | Dhar et al. ............. | 428/64.4 |
| 7,214,548 B2 | 5/2007 | Fayaz et al. | |
| 7,406,759 B2 * | 8/2008 | Yamamoto et al. .... | 29/559 |
| 7,987,888 B2 * | 8/2011 | Yamamoto et al. .... | 156/755 |
| 7,992,877 B2 * | 8/2011 | Balan ..................... | 279/3 |

(Continued)

FOREIGN PATENT DOCUMENTS

JP 60127935 A * 7/1985

(Continued)

*Primary Examiner* — Essama Omgba

(74) *Attorney, Agent, or Firm* — Blakely, Sokoloff, Taylor & Zafman LLP

(57) ABSTRACT

Methods and systems, in one embodiment, are described related to a chuck with a plurality of vacuum grooves on a surface. Each single vacuum groove of the plurality of vacuum grooves has a single port connected with a single vacuum line coupled to a vacuum source. The single vacuum line is not shared with another groove and a restriction is applied to the single vacuum line in order to isolate each single vacuum groove.

12 Claims, 11 Drawing Sheets

U.S. PATENT DOCUMENTS

| | | | |
|---|---|---|---|
| 8,070,199 B2 * | 12/2011 | Na et al. | 294/65 |
| 8,089,615 B2 * | 1/2012 | Mizutani et al. | 355/73 |
| 8,102,512 B2 * | 1/2012 | Shibuta et al. | 355/72 |
| 2001/0043858 A1 | 11/2001 | Bacchi et al. | |
| 2002/0036373 A1 * | 3/2002 | Kosakai | 269/21 |
| 2003/0044576 A1 * | 3/2003 | Dhar et al. | 428/137 |
| 2003/0044577 A1 * | 3/2003 | Dhar et al. | 428/137 |
| 2003/0106574 A1 | 6/2003 | Krolak | |
| 2003/0129051 A1 | 7/2003 | Friedman et al. | |
| 2004/0036850 A1 | 2/2004 | Tsukamoto et al. | |
| 2004/0074322 A1 | 4/2004 | Dvir | |
| 2005/0111944 A1 | 5/2005 | Aho et al. | |
| 2007/0063453 A1 * | 3/2007 | Ishikawa et al. | 279/3 |
| 2007/0082179 A1 * | 4/2007 | Wade et al. | 428/174 |
| 2007/0222131 A1 * | 9/2007 | Fukumoto et al. | 269/21 |
| 2007/0252970 A1 | 11/2007 | Shibazaki | |
| 2008/0042674 A1 | 2/2008 | Dunklee | |
| 2009/0305617 A1 * | 12/2009 | Nakamura et al. | 451/364 |

FOREIGN PATENT DOCUMENTS

| | | | |
|---|---|---|---|
| JP | 05047909 A | * | 2/1993 |
| JP | 05082631 A | * | 4/1993 |

* cited by examiner

THIN WAFER CHUCK

FIELD OF THE INVENTION

This invention relates to systems and methods of a vacuum chuck for engaging a thin flexible object during one or more of a probing, inspection, assembly, or manufacturing process.

BACKGROUND OF THE INVENTION

Probing involves contacting a pad surface of an integrated circuit (IC) with a probe tip. The process involves positioning of probe pads (such as bonding pads on an IC) relative to probe tips. The positioning of bonding pads, in one system, is achieved by positioning a wafer containing the devices under test.

A semiconductor wafer typically includes many integrated circuits formed in a lattice of devices or integrated circuits. In some cases, a wafer may include a single discrete component rather than an IC, and these components may also be arranged in a lattice on the wafer. Each IC has a plurality of bonding pads that are commonly used to connect the IC to external circuitry or devices. Given the cost of packaging ICs, most ICs are tested in a wafer probing system prior to packaging.

As the semiconductor manufacturing art progresses, wafer manufacturing capabilities allow the production of thinner wafers. However, as a result, warped or thin flexible wafers become more difficult to handle on vacuum chucks. Hence, it is desirable to provide a vacuum chuck system that can effectively and securely flatten and hold thin flexible objects without causing damage.

SUMMARY OF THE DESCRIPTION

Improved apparatuses, methods and systems are provided having a chuck with a plurality of vacuum grooves on a surface.

According to one embodiment of an aspect of the invention, a single vacuum groove of the plurality of vacuum grooves has a single port connected with a single vacuum line being coupled to a vacuum source. The single vacuum line is not shared with another groove. Furthermore, a restriction is applied to the single vacuum line in order to isolate each single vacuum groove. The restriction may be a minimum length of hose connecting the groove to a vacuum source or may be an intentionally introduced restriction.

According to another aspect of the present invention, the single port is within the single vacuum groove. The single vacuum groove is configured to be separate from other grooves to allow a pressurized vacuum region to be created when a vacuum suction is applied to engage a warped object to the surface of the chuck.

In one example of the present invention, the restriction that is applied to the single vacuum line is a single hose having a hose length configured to isolate a sealed groove from a leaking groove within the plurality of vacuum grooves.

In one example of the present invention, a single vacuum groove is capable of maintaining a sealed vacuum suction of at least 80% of a maximum vacuum suction within a groove.

In one example of the present invention, the single hose has a length of about 42 inches and an inner hose diameter of about 0.0625 inches to create a restriction between the plurality of vacuum grooves.

In another example of the present invention, the restriction that is applied to the single vacuum line is a needle valve.

In one embodiment of the present invention, a plurality of vacuum grooves are arranged in a plurality of concentric circular grooves across the surface of the chuck. The plurality of concentric grooves are spaced about 1 inch in diameter apart from one another.

In one example of the present invention, a first ring has a diameter of about 1 inch and a seventh ring has a diameter of about 7.2 inches. The single port of each single vacuum groove is arranged along a radial line extending from a center of the chuck to an outer radius of the chuck.

According to another aspect of the present invention, at least one sensor is connected with the single vacuum line to determine whether a pressurized vacuum region is present within the single vacuum groove.

According to one embodiment of an aspect of the present invention, a warped object is located on a surface of a chuck. The chuck has a plurality of vacuum grooves in the surface of the chuck. Each single vacuum groove of the plurality of vacuum grooves has a single and only port connected with a single vacuum line coupled to a vacuum source. The single vacuum line is not shared with another groove. Moreover, a restriction is applied to the single vacuum line in order to isolate each single vacuum groove when a vacuum suction is created by the vacuum source.

According to an aspect of the present invention, a vacuum suction is applied to the single port located within the single vacuum groove. The single vacuum groove is configured to be separate from other grooves in order to allow a pressurized vacuum region to be created when the vacuum suction is applied to engage the warped object to the surface of the chuck.

In one example of the present invention, the vacuum suction created by the vacuum source is applied so that the warped object, which is a warped wafer, is flattened on the top surface of the chuck.

According to an aspect of the present invention, each single vacuum groove is isolated with the restriction being a hose length which is set to exceed a minimum length or minimum inner diameter to achieve sufficient resistance to isolate the groove from other grooves.

According to another aspect of the present invention, each single vacuum groove is isolated with the restriction being a needle valve.

In one example of the present invention, a pressurized vacuum region within each single vacuum groove is sensed with at least one sensor. Furthermore, a blower is activated in response to the at least one sensor.

According to one embodiment of an aspect of the present invention, a system having a base supported by a frame, a stage supported by the base and being configured to be moveable relative to the frame is provided. Furthermore, a chuck is coupled to the stage and configured to support an object. The chuck has a plurality of vacuum grooves on a surface. Each single vacuum groove of the plurality of vacuum grooves has a single port connected with a single vacuum line coupled to a vacuum source. The single vacuum line is not shared with another groove and a restriction is applied to the single vacuum line in order to isolate each single vacuum groove. Furthermore, at least one sensor is coupled with the single vacuum line and the at least one sensor is configured to determine when a pressurized vacuum region is created within the single vacuum groove that is associated with the single vacuum line.

According to another aspect of the present invention, a blower system is configured to activate a blower to create a downward pressure on the object supported by the chuck in response to at least one sensor.

In one example of the present invention, the restriction that is applied to the single vacuum line is a single hose having a hose length configured to isolate a sealed vacuum groove from a leaking groove within the plurality of vacuum grooves.

The solutions provided by at least certain embodiments of the invention thus results in a system with an improved vacuum wafer chuck for holding thin flexible wafers. In certain embodiments, these thin flexible wafers may contain a plurality of die, each of which contains a discrete electrical component such as a power transistor with a back side contact. These and other embodiments, features, aspects, and advantages of the present invention will be apparent from the accompanying drawings and from the detailed description and appended claims which follow.

BRIEF DESCRIPTION OF THE DRAWINGS

The present invention is illustrated by way of example and not limitation in the figures of the accompanying drawings in which like references indicate similar elements.

DETAILED DESCRIPTION

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

At least certain embodiments of the invention may be used to test or inspect a component such as an integrated circuit or a wafer containing a plurality of integrated circuits or a substrate containing one or more other components. The following description is directed to wafer probing, but it will be understood that wafer probing is merely one example of an embodiment of the invention, and that all other examples of other embodiments will not be used for wafer probing but rather for other operations.

Wafer probing involves contacting the pad surface with probe tips. Probe tips move or deform during the operation of probing. This action makes the probe tips scrub or slide across the bond pads, balls/bumps or contact surfaces of the wafer being tested. This mechanical action is necessary to break through the contamination and oxide on the probe tips and/or the pads. In addition, a large amount of pressure is used to scrub away an oxide or contamination layer.

In one embodiment of the present invention, a prober system consists of two main components, or stages, one holding a wafer and the other a probe card. The two stages move relative to one another and are brought together in order to create the high pressure contact between the bond pads and the probe tips.

Figure 1:
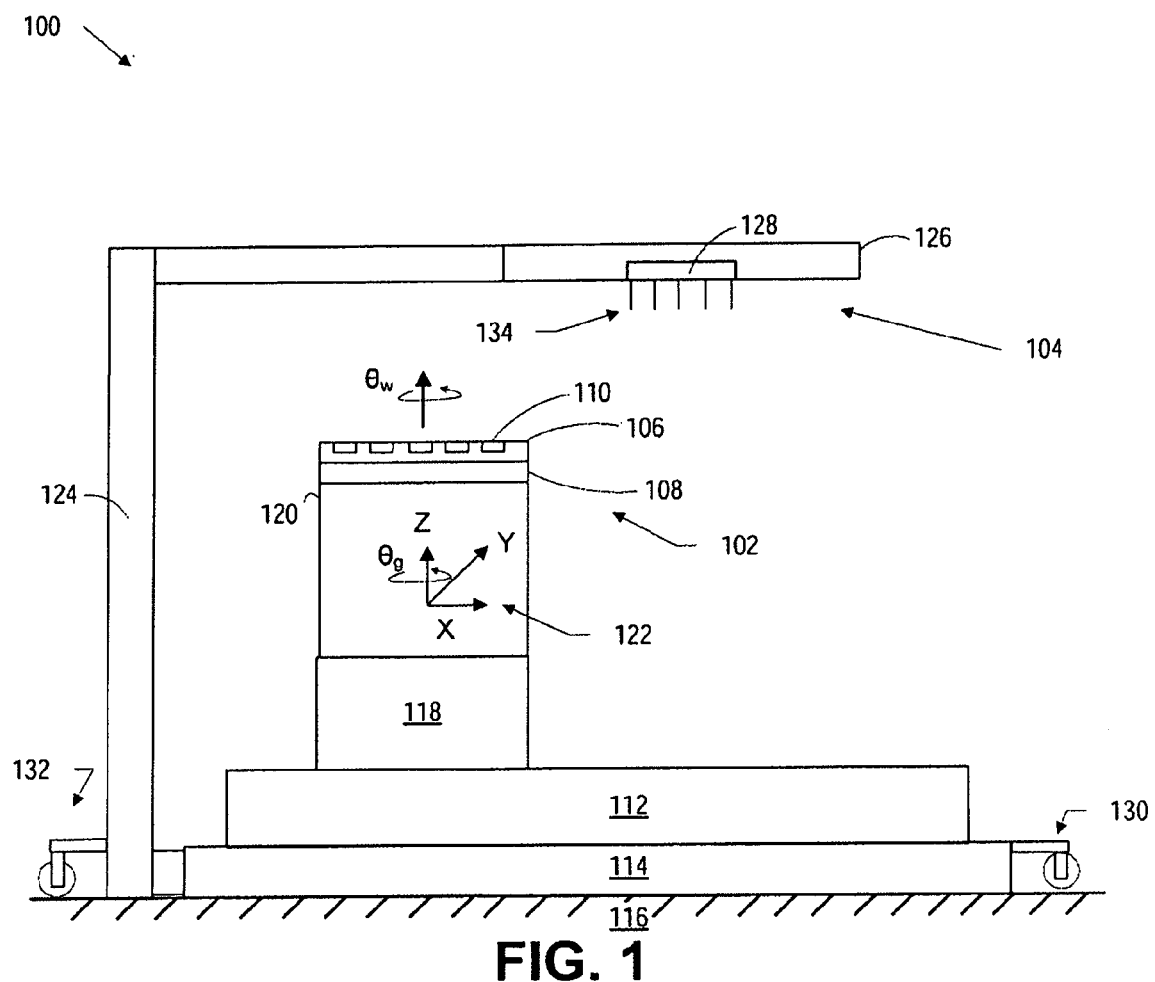
FIG. 1 shows a front view of a prober system.

FIG. 1 shows a schematic of one such possible embodiment of a system 100, comprising of two main stages. The main stages are the wafer holder assembly 102 and the probe-card holder assembly 104. In this illustrative example, the wafer holder assembly (hereinafter, "WHA") 102 is capable of motion along the X, Y, Z and $\theta_g$ directions while the probe card holder assembly (hereinafter, "PCHA") 104 is held stationary. In another embodiment, the WHA 102 can be held stationary while the PCHA 104 is capable of motion. In yet another embodiment, the WHA 102 and PCHA 104 can both be capable of motion. In another embodiment, the wafer 106 itself can be rotated around the $\theta_w$ direction relative to its holding chuck 108 in the wafer holder assembly 102. In this manner, the wafer 106 being supported by the wafer holder assembly 102 can be moved relative to the probe card pins 134 being supported by the probe-card holder assembly 104 so that the pins 134 can be brought in contact with conductive elements 110 such as pads or balls/bumps on the wafer 106.

The WHA 102 is supported by a granite base 112 and a metal frame 114 which is located on a support surface 116. The WHA 102 includes a motion system 118, a Z stage 120, and a holding chuck 108. The holding chuck 108, in one embodiment, holds the wafer 106 to present a number of bond pads 110 for testing. The holding chuck 108, being movable in the X, Y, Z and $\theta_g$ directions 122, is connected to the Z-stage 120. The X-Y motion system 118 can be an X-Y gantry system or a sawyer motor system as will be described in further detail. The X-Y motion system 118 is connected with a Z stage 120 which is capable of moving in the Z-direction to allow the probe pins 134 to make contact with the pads 110 on the wafer 106. The X-Y motion system 118 is also connected with an encoder or sensors to track the position, velocity, and acceleration of the Z-stage 120 and wafer 106.

FIG. 1 further shows a PCHA 104 which includes a support member or assembly 124, a ring carrier 126, a probe card 128, and probe tips 134. The ring carrier 126 is supported by the support assembly 124 and can be made of a metal such as aluminum or steel. The support assembly 124 is connected with the metal frame 114 which is connected with the granite base 112. In this embodiment, the PCHA 104 is stationary; however, it is possible to provide the PCHA 104 with a motion mechanism so that the probe card can move with respect to the WHA 102.

The probe card 128 is connected with the probe tips 134 and presents the probe tips 134 for contact with the wafer 106.

In this illustrative example, when the Z-stage 120 is actuated, the probe tips 134 come into contact with the conductive elements 110.

The system 100 may be moved on wheels, such as wheels 130 and 132. The wheels 130 and 132 are preferably part of a set of wheels, such as four wheels, although any number of wheels can be used. The wheels can be retracted so that the metal frame 114 and granite base 112 rests on the floor either directly on the floor or by retractable legs. In FIG. 1, the wheels 130 and 132 are in a retracted position although the wheels can be moved into an extended position so that the system 100 can be rolled across the support surface 116 making the system 100 portable. The system 100 may have a pre-aligner system (not shown).

Figure 2A:
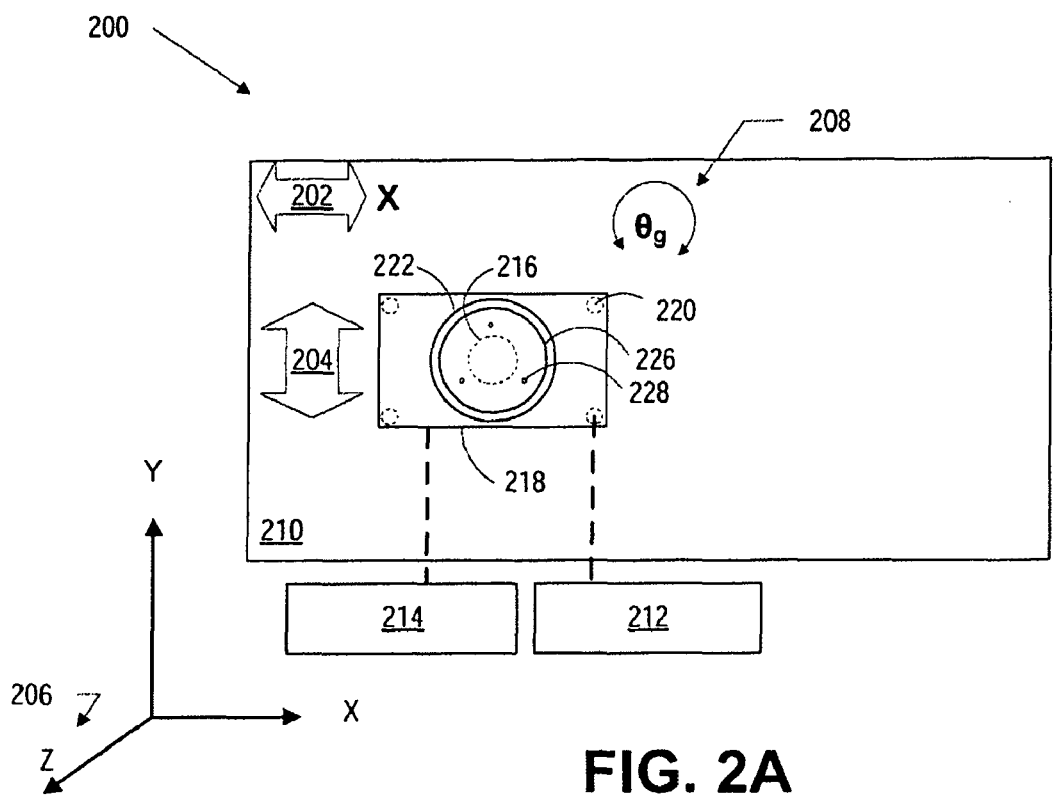
FIG. 2A shows a top view of a prober having a sawyer motor system, according to a possible embodiment.

FIG. 2A is a top view of a similar system shown in FIG. 1 having a sawyer motor system 200 arrangement. In this embodiment, the X-Y motion system 118 is a sawyer motor system 200 having a smooth platen surface 210, a platform 218 having a magnetized forcer (not shown) and driving coils which affect the magnetic flux of the forcer to move the Z stage 222 and platform 218 in an X-direction 202 or Y-direction 204 over the surface of the platen 210.

In the sawyer motor system 200, the platen 210 is a non-porous surface so that air bearings 220 mounted to the platform 218, which supports the wafer holder assembly 102, can create a pressurized region between the platform 218 and the platen surface 210. Air bearings 220, such as orifice air bearings or porous media bearings, are attached to the lower surface of the platform 218 to blow downward toward the platen thus creating a uniform air gap between the platform 218 and platen 210.

In one embodiment, four air bearings 220 are located on four corners of the platform 218. The air bearings 220 are connected to an air supply 212 which provide an flow of air or other gas or fluid to the bearings 220 to create the gap between the platform 218 and platen 210.

The platform 218 is connected with a positioning control system 214 that communicates with the forcer to cause the platform 218 to move across the platen surface in the X-direction 202, Y-direction 204, or both. Vacuum lines may also be provided from a vacuum source to create suction on the surface of the holding chuck 226 causing a wafer 106 to remain stationary relative to the holding chuck 226.

A motor 216 is connected with the Z-stage 222 to allow the Z-stage 222 to move in the Z-direction 206. In one embodiment, the holding chuck 226 may also be capable of rotating about the Z-axis 206 in a $\theta_g$ direction 208. The sawyer motor system 200 may contain a pre-aligner system (not shown) where the holding chuck may receive a wafer. In one embodiment, the holding chuck 226 has lift pins 228 that receive the wafer in the transfer process with the pre-aligner system.

Figure 2B:
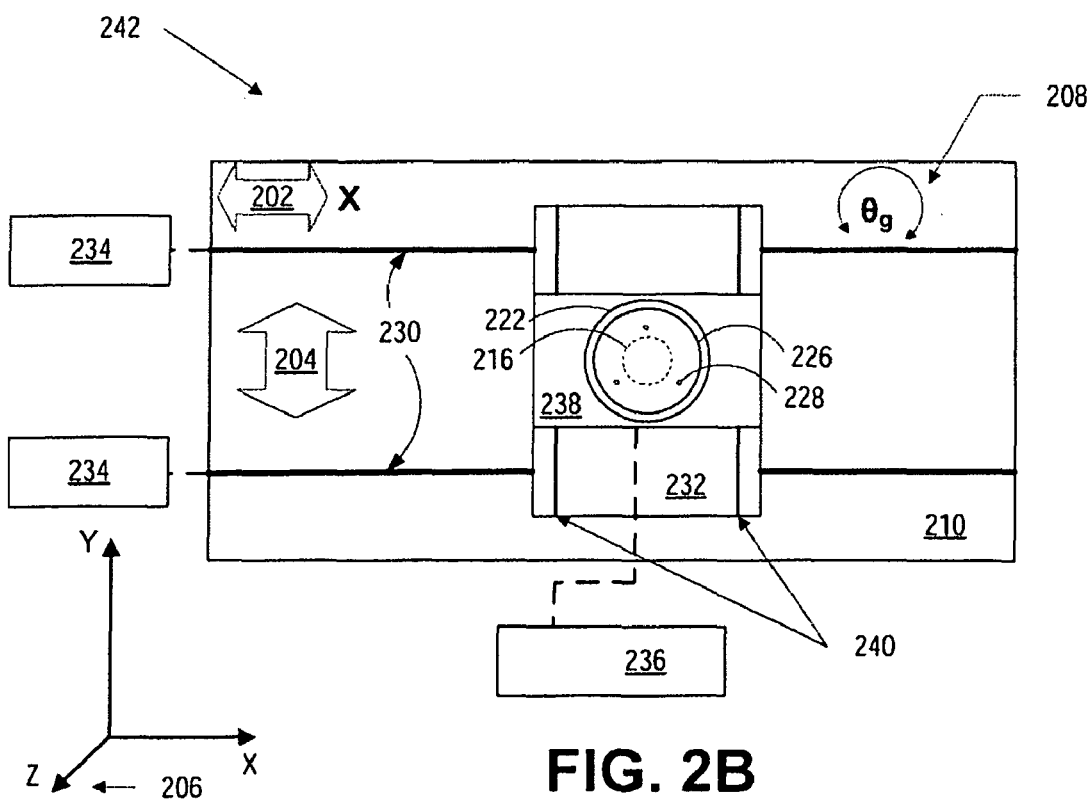
FIG. 2B shows a top view of a prober having an X-Y gantry system, according to another possible embodiment.

FIG. 2B illustrates an X-Y motion system 118 that is an X-Y gantry system 242. The X-Y gantry system 242 has a set of two X rails 230 that allow the Z-stage 222 to move in a linear and low friction manner in the X-direction 202. The X rails 230 channel the motion of the Z-stage 222 so that a motion by a bridge 232 in the Y-direction 204 is limited or non-existent. The bridge (or X-stage) 232 rests on top of the granite base 210 and X rails 230. The bridge 232 is connected with the Z-stage 222, however, it is possible to have the Z-stage 222 be independently supported by air bearings or blow holes. The bridge 232 also is connected with the holding chuck 226 which holds a wafer or object. The holding chuck 226 is moved along the X direction 202 on the X rails 230 with respect to the granite base 210 by two X-motors 234 that are connected with the bridge 232. It is appreciated that the holding chuck 226 can be moved in the X-direction 202 by one X-motor, or any number of motors, instead of only two motors. In one embodiment, other additional motion mechanisms housed in the gantry system can move the holding chuck 226 in the Y, Z, and theta (θ) directions.

Furthermore, in the X-Y gantry system, a Y-motor 236 is connected with a Y-stage 238 that is connected with two Y-rails 240 that guide the Y-stage 238 in a Y-direction 204. The Z-stage 222 is supported or connected with the Y-stage 238 so that the holding chuck 226 and wafer or object can also be moved in the Y-direction 204. The Y-motor 236 could be mounted within the X-Y motion system 118 or it could be remotely mounted and connected with the Y-stage 238 to enable the holding chuck 226 to be moved in the Y-direction 204.

In one embodiment, a brushless rotary motor 216 within the X-Y gantry system 242 is capable of raising the Z-stage 222 in a Z-direction 206 or theta ($\theta_g$) 208 direction. Depending on the specific use of the system, the rotary motor 216 can be replaced or used in combination with piezo-electric elevating mechanisms, linear motors, ball and screw arrangements, slider mechanisms that transfer a lateral force to a vertical force to drive the Z-stage 222 in the Z-direction 206, air bearings, or other arrangement for moving the Z-stage 222 in the Z-direction 206. The motor 216 is preferably mounted within the X-Y motion system 242; however, in another embodiment, the motor 216 can be remotely mounted to drive the Z-stage 222 in the Z-direction 206 or theta direction 208.

It is also appreciated, in another embodiment, that the Z-stage 222 can float above a granite base having a series of evenly distributed air orifices which blow air upwards towards the Z stage 222 in order to help it move smoothly over the granite base and thus alleviate some of the contact friction between the Z-stage 222 and the granite base. The X-Y gantry motion system 242 can also includes a pre-aligner system as briefly described above.

Figure 3A:
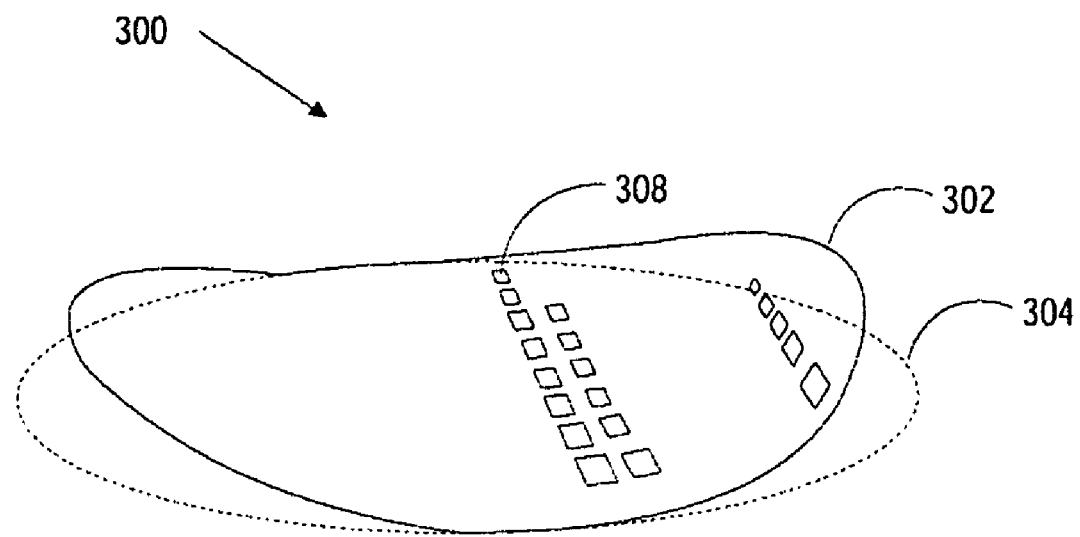
FIG. 3A shows an isometric view of a warped flexible wafer.

FIG. 3A illustrates a thin flexible wafer 300 having a thickness in the range of about 50 microns to about 12 mils. Because of the thin flexible nature of the wafer 300, warping may occur in the wafer. A warped wafer 302 can have significant compliance or flexing with respect to a flat wafer 304. Each flexible wafer 300 has an electronic component which has at least one contact pad 308.

Figure 3B:
FIG. 3B shows a front view of a warped flexible wafer.

FIG. 3B illustrates a warped wafer 302 having a flexing dimension 306. The flexing dimension 306 of the warped flexible wafer 302 can be within a range up to 12 mm without causing damage to the components of the wafer. Because of the extreme amount of warping that may be present in the warped wafer 302, wafer handling techniques need to be improved to ensure that a warped wafer 302 is properly secured to a chuck before processing or testing.

Figure 4:
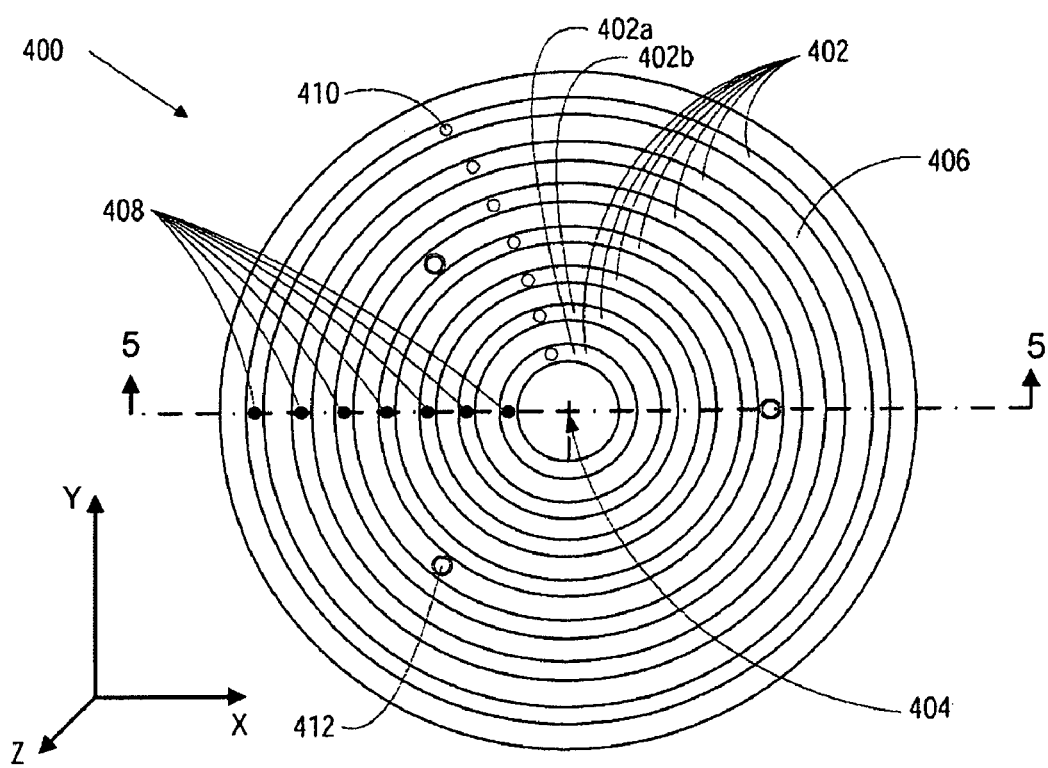
FIG. 4 shows a top view of a vacuum chuck, according to one possible embodiment.

FIG. 4 illustrates a top view of a vacuum chuck 400 having a plurality of concentric vacuum grooves 402 within a top surface 406 of the vacuum chuck 400. Each vacuum groove 402 contains a vacuum sensor 410 that is used to determine if a vacuum pressure is crated within the vacuum groove 402. The plurality of concentric vacuum grooves 402 share a common center axis 404 that is parallel with the Z-direction Furthermore, the plurality of concentric vacuum grooves 402 are isolated from each other so that a suction in one vacuum groove 402 does not affect the vacuum suction of another adjacent vacuum groove 402. For example, in one embodiment, a first inner vacuum groove 402a is isolated from a second inner vacuum groove 402b because the top surface 406 creates a concentric barrier between the two grooves. The grooves 402 are physically isolated from one another across the top surface 406 of the vacuum chuck 400 by protruding concentric portions forming the top surface 406. When a flattened object is placed on the vacuum chuck 400, the protruding concentric portions of the vacuum chuck 400 and a bottom portion of the object create a concentric groove that is capable of being pressurized and isolated from other grooves.

In one embodiment, the grooves are evenly spaced starting at one inch in diameter for the first inner vacuum groove 402a and increasing by about one inch in diameter to an outer diameter of about 7.2 inches for a seventh groove. In one embodiment, each groove or sub set of grooves is isolated from the next groove and each groove has its own source of vacuum so that if one or all of the other grooves are leaking, a sealed vacuum groove will maintain a vacuum suction of about 20 inHg or higher on an eight inch thin flexible wafer.

Each vacuum groove 402 is connected with a single source vacuum hole or port 408. The single source hole 408 is important because it forces all the air flow to go through the groove and provides maximum air flow at the location of wafer separation from the chuck surface, as will be described in greater detail.

FIG. 4 further illustrates the single source holes or ports 408 being located along a radial line extending in an X-direction from the center axis 404. All the vacuum holes 408 are located in the same small pie shaped section of the vacuum chuck 400. In one embodiment, the vacuum holes can be arranged in a non-linear or staggered arrangement within a small pie shaped section of the vacuum chuck 400.

FIG. 4 also shows three lift pins 412 that are each able to move to a lift position or retract to a retracted position for receiving or removing a wafer object or manufacturing piece.

Figure 5:
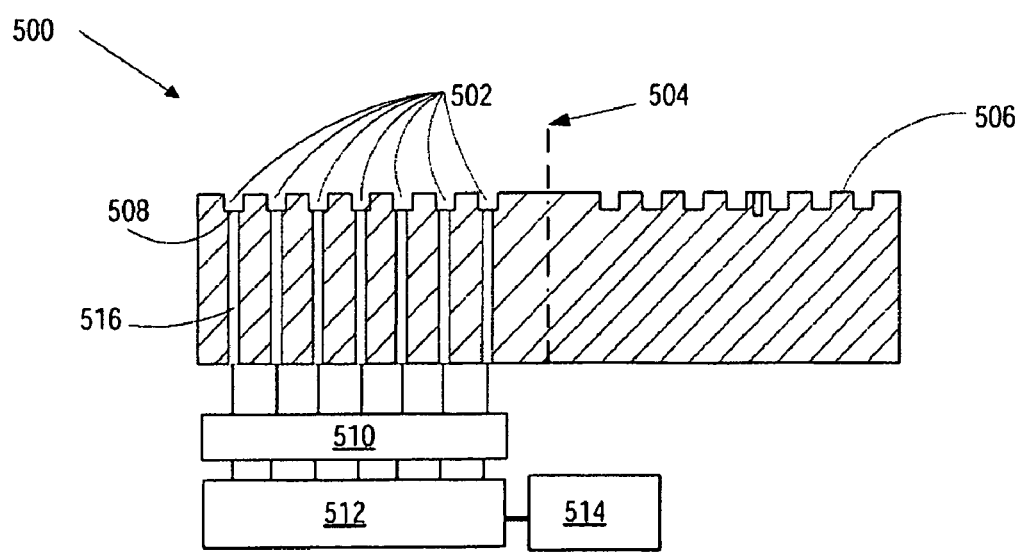
FIG. 5 shows a cross-sectional side view along lines 5-5 of FIG. 4 of a vacuum chuck, according to one possible embodiment.

FIG. 5 illustrates a cross-sectional side view of the vacuum chuck 500 along the lines 5-5 of FIG. 4. The vacuum chuck 500 has a center axis 504 and top chuck surface 506 as previously described. Each vacuum groove 502 has a single vacuum hole or port 508 which is connected to a restriction 510 by a passageway or vacuum line 516 through the vacuum chuck 500. In one embodiment, the vacuum line 516 includes the passageway through the vacuum chuck 500 and any connected hoses or tubes that couples to the vacuum source 514. In one exemplary embodiment, the restrictions 510 can be caused by the specific dimensions, such as length, inner diameter, and material of a hose section. In another embodiment, the restrictions 510 may be caused by needle valves attached to each hose. In one embodiment, each restriction 510 can be specifically selected for the individual vacuum hole 508.

In one embodiment, all the restrictions 510 for the vacuum holes 508 are substantially identical meaning that the hose lengths and diameters impart the same amount of flow restriction on vacuum suction for each vacuum hole 508.

In one embodiment, the restrictions 510 are connected with a valve system 512 and vacuum source 514. In one embodiment, the valve system 512 can be an electromagnetic valve arrangement, manual, or automatic valve arrangement. The valve system 512 may be connected with a controller to determine when a vacuum suction should be applied to the vacuum lines 516 by the vacuum source 514, depending on the size of the wafer or object being processed. In this embodiment, the vacuum lines 516 associated with a specific wafer size are turned "all on". In another embodiment, the vacuum source 514 and valve system 512 is also an "all on" system in which a vacuum suction is applied to all vacuum grooves regardless of the type of wafer or object placed on the vacuum chuck 500. Therefore, in this embodiment, the valve system 512 switches between an "all on" or "all off" position for all vacuum lines 516.

Figure 6A:
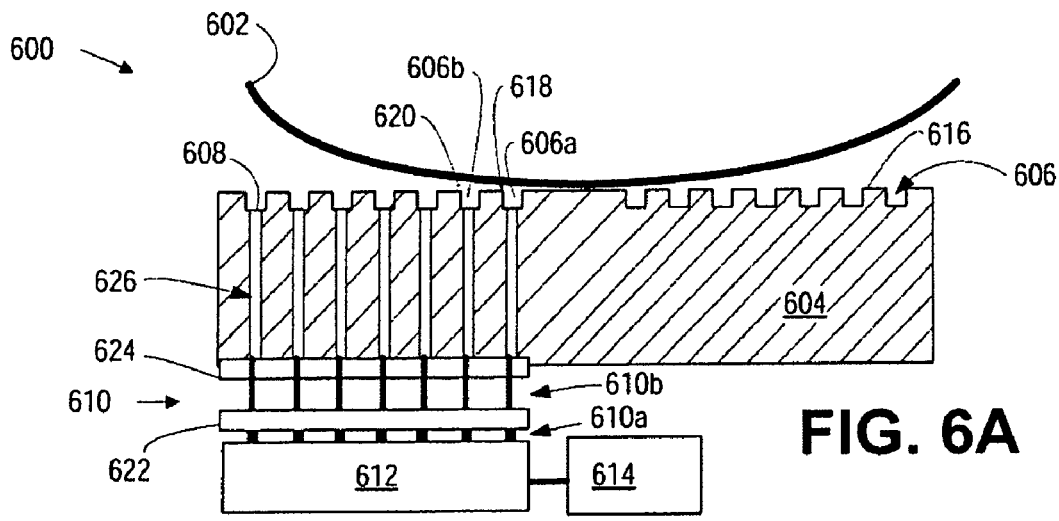
FIGS. 6A, 6B, and 6C show a cross-sectional side view of a vacuum chuck of the present invention during an engagement of an object, according to another possible embodiment.

FIG. 6A shows an eight inch warped flexible wafer 602 placed on a top surface 616 of a vacuum chuck 604. The vacuum chuck 604 includes a single vacuum suction hole or port 608 within a vacuum groove 606 as already described in FIGS. 4 and 5. In one embodiment, the warped wafer 602 is curved away from the top surface 616 of the vacuum chuck 604.

FIG. 6A shows a vacuum source 614 and valve arrangement 612 being activated while the restrictions 610 act to restrict the vacuum suction and air flow through each vacuum hole 608 and chuck groove 606.

In one exemplary embodiment, the restrictions 610 each include a first hose 610a having a length of 36" and an inner hose diameter of ⅛". The first hose is made of a rubber or flexible material and connects the valve system 612 and vacuum source 614 to a second hose 610b. The first hose 610a is connected with a second hose 610b through a connecting piece 622. In one embodiment, the second hose 610b has a length of 42" and an inner diameter of 1/16". It should be noted that the first hose 610a has a larger inner diameter but a shorter hose length when compared to the second hose 610b. The second hose 610b is connected to vacuum lines or passageways 626 in the vacuum chuck 604 through a manifold piece 624.

FIG. 6A shows the first inner vacuum groove 606a and second inner vacuum groove 606b are initially not fully engaged with the bottom surface of the wafer 602. A tangential region or first gap 618 is defined between the wafer 602 and top surface 616. When the vacuum source 614 and valve system 612 are activated, the first gap 618 has a high air flow value due to the vacuum suction. A second gap 620 is located between the top surface 616 and wafer 602 near the second inner vacuum groove 606b. The second gap 620 is larger than the first gap 618 and has a lower air flow value than the first gap 618 when the wafer 602 is not fully engaged with the first inner vacuum groove 606a, upon activating an "all on" vacuum suction.

The high air flow value within the first gap 618 causes a pull force to act on the bottom surface of the wafer 602 to cause the wafer 602 to be pulled down and secured to the first inner vacuum groove 606a. As a result, the second gap 620 is reduced and the vacuum suction and pull value becomes greater above the second inner vacuum groove 606b. Thus, the wafer 602 is pulled down further so that a vacuum suction is created within the second inner vacuum groove 606b between the wafer 602 and vacuum chuck 604. The above process continues to pull the wafer 602 down toward the vacuum chuck 604 in a radial direction until all the grooves 606 are engaged with the wafer 602.

Figure 6B:
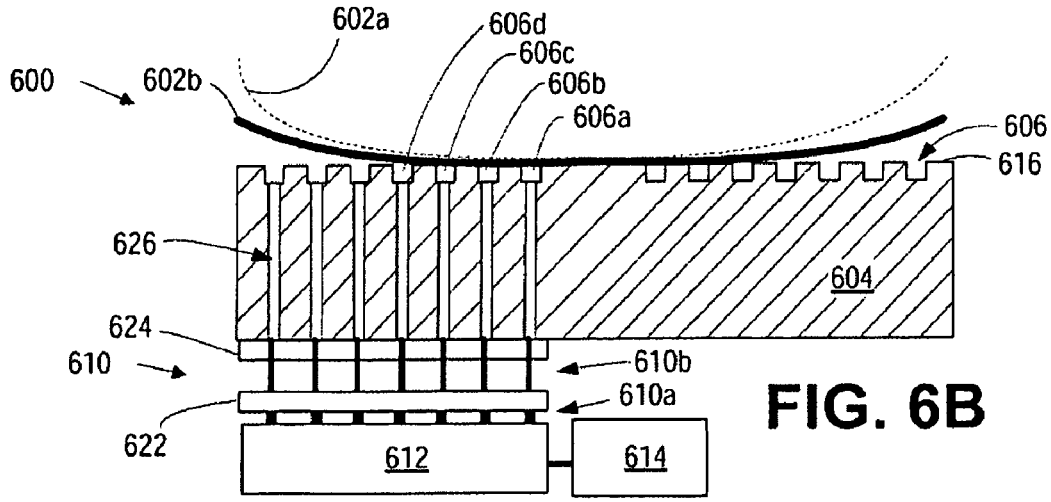

FIG. 6B shows the first 606a, second 606b, and third 606c vacuum grooves fully engaged with the wafer 602. The wafer 602 has moved from a first position 602a (shown in ghost lines) to a second position 602b by virtue of the suction of the wafer 602 to the vacuum chuck 604. In FIG. 6B, the fourth vacuum groove 606d is not fully engaged. In one embodiment, the separate arrangement of the restrictions 610 has enabled the vacuum suction within each vacuum groove 606 to be isolated from one another while enabling a maximum air flow value to be created in the gap between the wafer 602 and the top surface 616 of the chuck 604. A high air flow value in the gap region results in a greater pull-down force on the wafer 602.

In an exemplary embodiment of FIG. 6B, the engaged first vacuum groove 606a has a vacuum pressure of about 25 inHg between the wafer 602 and vacuum chuck 604. The engaged second vacuum groove 606b and third vacuum groove 606c have a vacuum pressure of about 20 inHg (80% of 25 inHg). The disengaged fourth vacuum groove 606d still has a gap between the wafer 602 and vacuum chuck 604 and thus has a pressure of 0 inHg. Because of the specific restrictions applied and separate restriction arrangement, the first 606a, second 606b, and third 606c vacuum groove pressures are not greatly affected by the zero value of the fourth vacuum groove 606d.

In one embodiment, at least 80% of the maximum suction pressure within a groove can be maintained across all vacuum grooves. Therefore, a relatively constant suction pressure can be maintained when one vacuum groove is measured at 100% vacuum suction pressure and when other vacuum grooves are leaking. A vacuum groove leak may be evident when air flow is present within the groove and a pressure drop is found. Again, the hose length and restriction specifications are critical to maintaining a high vacuum pressure amongst all sealed vacuum grooves. In a leaking groove, at least 80% of the maximum suction pressure (within a groove) is maintained.

Figure 6C:
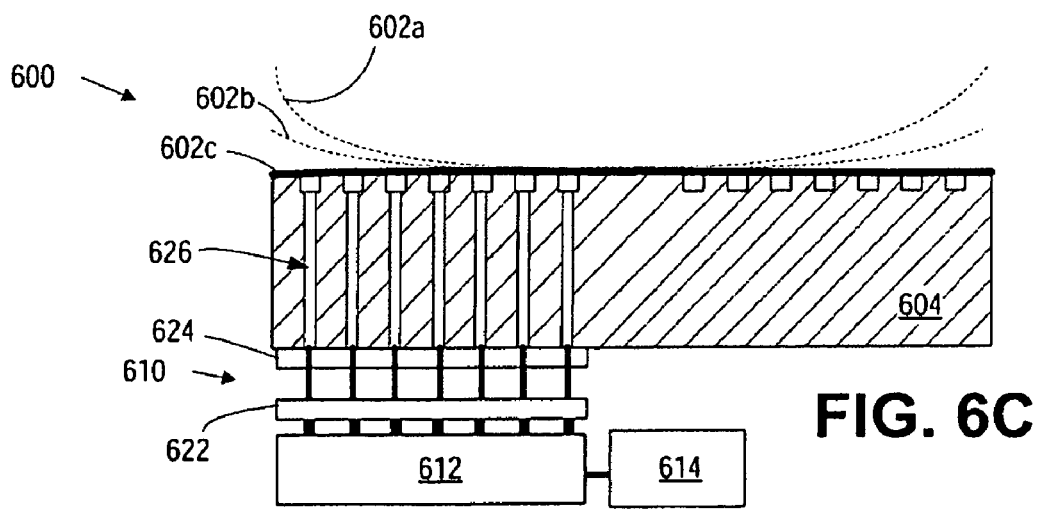

FIG. 6C illustrates the wafer 602 in a third and final position 602c where the wafer 602 is substantially flat and secured by vacuum suction created in all of the vacuum grooves 606. In the final substantially flat position 602c, the wafer 602 is ready for further processing or testing.

Figure 7A:
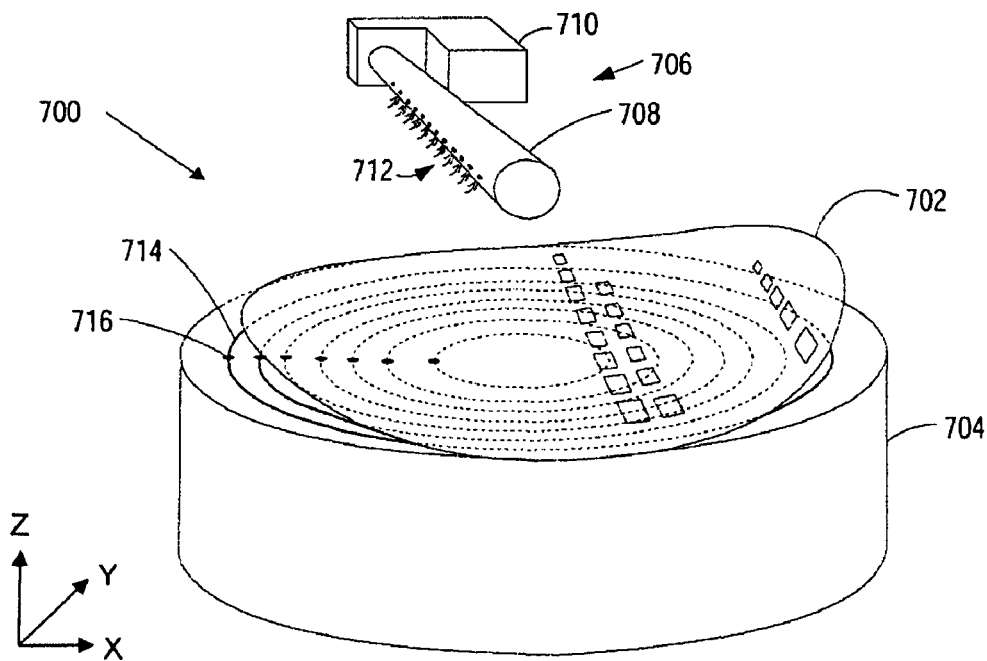
FIG. 7A is an isometric view of a vacuum chuck and blower system.

FIG. 7A shows an isometric view of a vacuum chuck 704 and a blow-down mechanism or blower 706 arrangement 700. A flexible eight inch wafer 702 is shown in a first position without a vacuum suction being applied through the vacuum chuck 704. The blower 706 is located in a position above the wafer 702 and has a tubular or rod section 708 that is connected with a base portion 710. In one embodiment, the base portion 710 is connected with a supporting structure that is attached to the frame or base of the entire system 100. The tubular section 708 of the blower has a plurality of blow holes 712 which blow air or gas in a downward Z-direction toward the vacuum chuck 704 and wafer 702. In one embodiment, the plurality of blow holes 712 are arranged in a line parallel with the central axis of the tubular or rod section 708. The blow holes 712 are located on a bottom surface of the tube 708 in order to blow air toward the wafer 702 or object.

In one embodiment, the blow-down mechanism or blower 706 is used for cooling or cleaning the wafer 702 or object. In addition, the blower 706 can be used to pneumatically push a wafer 702 into vacuum suction contact with the vacuum chuck 704 as will be discussed in further detail. The vacuum chuck 704 contains vacuum grooves 714 and vacuum ports 716 as previously described.

Figure 7B:
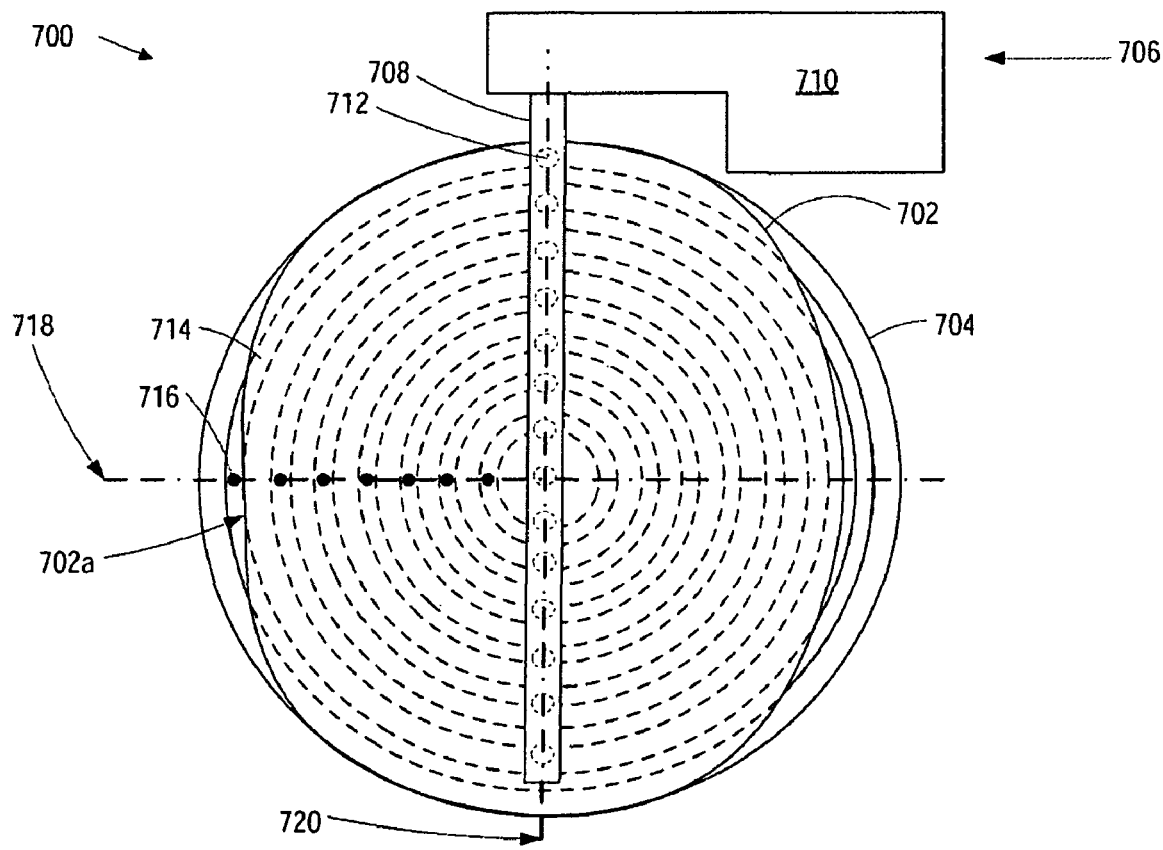
FIG. 7B is a top view of a vacuum chuck and blower system.

FIG. 7B is a top down view of the system shown in FIG. 7A. In one embodiment, the blower tube 708 has a centerline axis 720 that is perpendicular to the plurality of vacuum suction holes 716 that are aligned along a radial axis 718 on the vacuum chuck 704. The eight inch wafer 702 shown in FIG. 7B is unsecured to the vacuum chuck 704 and cannot fully engage with all the vacuum suction ports 716 on the wafer chuck 704. In one embodiment, the blower tube 708 is aligned in a direction along the wafer 702 that is in physical contact with the vacuum chuck 704. In other words, the blower tube 708 is placed so that thin flexible wafer 702 curls about the central axis 720 of the blower tube 708. In another embodiment, the central axis 720 of the blower tube 708 may be aligned in parallel with the radial axis 718 and plurality of vacuum ports 716.

In one embodiment, the blow holes 712 on the blower tube 708 are directed toward a curled portion of the wafer 702a located above the vacuum suction holes 716 of the vacuum chuck 704. It is understood that the blower tube 708 can be moved to direct air flow in any desired direction.

Figure 8A:
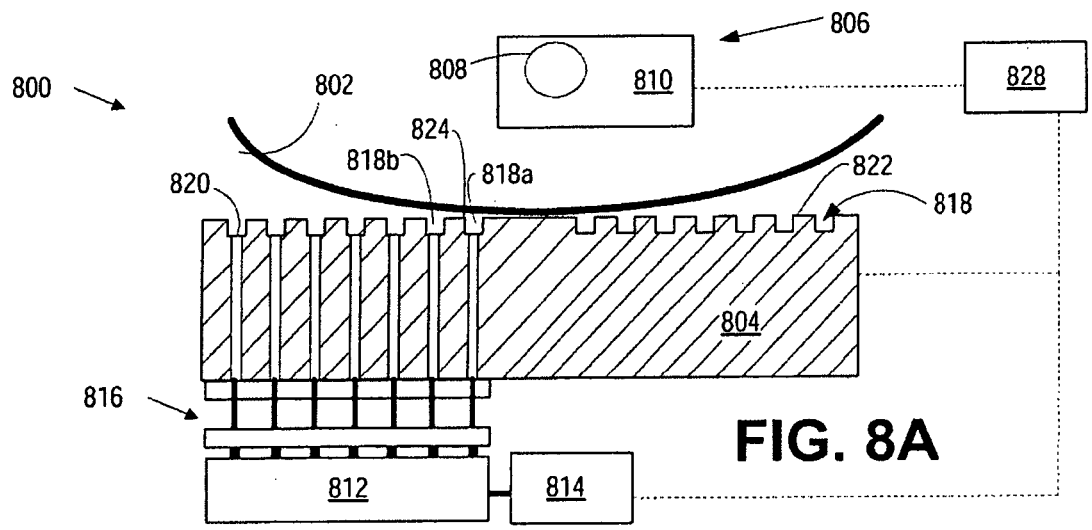
FIGS. 8A, 8B, and 8C show a cross-sectional side view of a vacuum chuck with respect to a blower system during an engagement of an object, according to another possible embodiment.
Figure 8B:
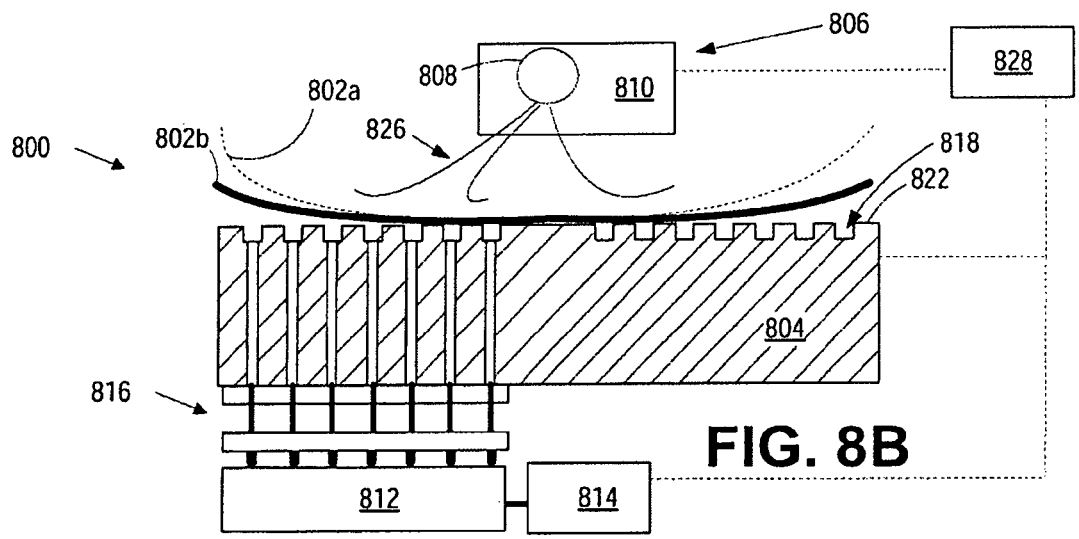
Figure 8C:
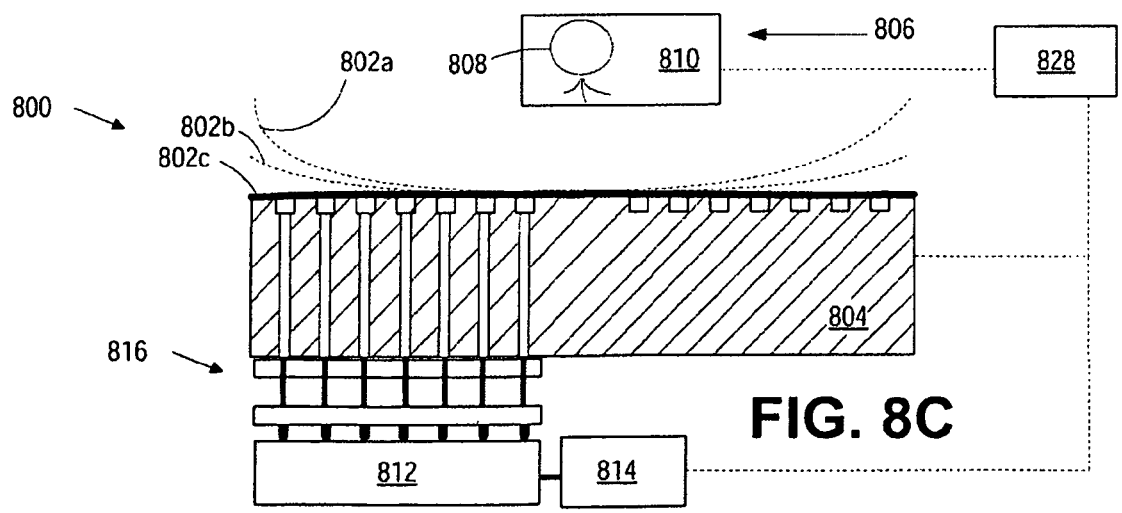

FIGS. 8A, 8B, and 8C illustrate a cross-sectional view of a system similar to that shown in FIGS. 7A and 7B. In FIG. 8A, the blower 806 is not activated but is arranged above the warped or curled wafer 802. When the vacuum source 814 is activated and the valve system 812 is open, the restrictions 816 allow a vacuum suction to be created in the vacuum groove 818 through the vacuum suction holes 820. A control system 828 is connected with the blower 806, the vacuum chuck 804, vacuum sensors, vacuum source 814, and valve system 812 for receiving and sending instructions and information.

In one exemplary embodiment, the warped flexible eight inch wafer 802 drastically curls away from the vacuum chuck 804 to such a degree that the first inner groove 818a is not in contact with the warped wafer 802. A tangential region or gap 824 where the wafer 802 almost touches the top surface 822 of the vacuum chuck 804 is the highest vacuum flow point. The gap 824 between the wafer 802 and the top surface 822 of the vacuum chuck 804 has a high pull force on the wafer 802 due to the high air flow created by the vacuum suction holes 820.

In one exemplary embodiment, all the vacuum suction holes 820 are turned on simultaneously, however, the gap 824 between the wafer 802 and the top surface 822 of the vacuum chuck 804 is so large that the air flow created by the vacuum suction holes 820 cannot pull the wafer 802 into vacuum suction contact with the first inner groove 818a. In this situation, the activation of the blower 806 is required.

FIG. 8B shows the blow tube 808, mounted to a base portion 810, being activated to cause air 826 or gas to blow down on the wafer 802 to force the wafer 802 from a first position 802a to a second position 802b where at least one or more vacuum holes 820 and grooves 818 create a vacuum suction to secure the wafer 802 to the top surface 822 of the vacuum chuck 804.

FIG. 8C illustrates the wafer 802 in a final position 802c where all the vacuum grooves 818 have created a vacuum suction to result in a substantially flat object or wafer 802 for further process or testing as already described. In one embodiment, the restrictions 816 are selected to enable the vacuum chuck to operate in a fast and efficient manner while turning on all valves 812 all at once to engage the wafer 802 with the vacuum suction created by the vacuum source 814.

It is understood that the blower system 806 can be activated in any situation where a specific groove is not creating a sufficient vacuum suction. Although the discussion above is related to a situation when the wafer 802 is not engaged with the first vacuum groove 818a, the blower system 806 can be used when any number of grooves 818 are not in vacuum contact with the wafer 802.

Figure 9:
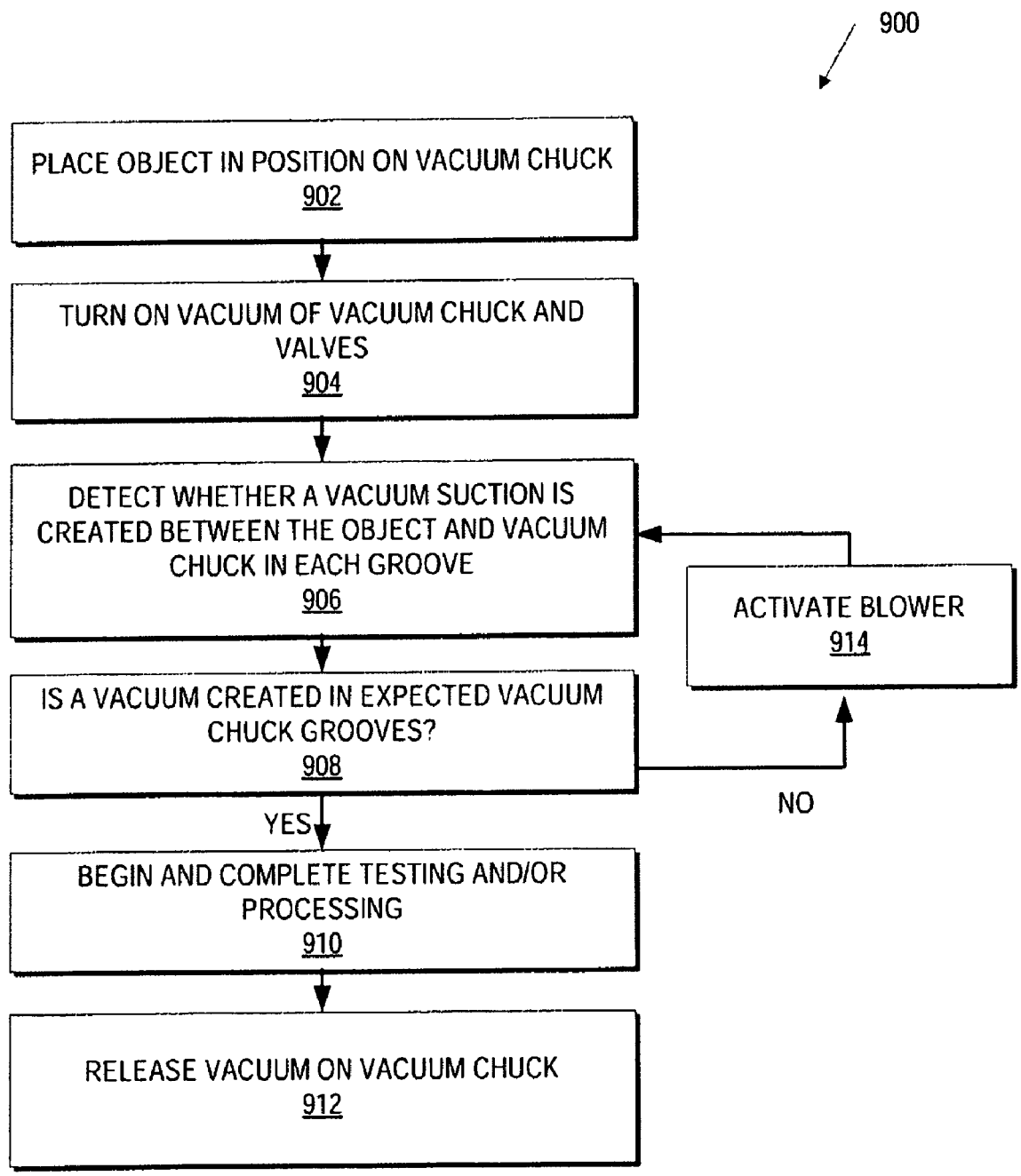
FIG. 9 is a flow chart which illustrates various operations according to one embodiment of a method of the present invention.

FIG. 9 illustrates a flow chart 900 showing various operations according to one embodiment. The object or flexible warped wafer 300 is initially placed 902 in position on a vacuum chuck. The vacuum source and valves connected with the vacuum chuck are turned on 904. Vacuum sensors detect 906 whether a vacuum suction is created between the wafer and the vacuum chuck in each groove.

Depending on the size of the wafer 300 being attached, certain grooves are expected to create a vacuum suction. For example, a four inch wafer is expected to cover at least the first three inner vacuum grooves while an eight inch wafer is expected to cover all seven vacuum grooves. A determination 908 is made with the use of sensors to decide which specific vacuum grooves should have a vacuum pressure and whether a vacuum pressure is present within those grooves.

If a vacuum suction is not detected in a at least one vacuum suction groove when a vacuum pressure is expected, the blower may be activated 914 based on a timed interval or according to the vacuum sensors or other sensors such as position sensors. After the blower is activated 914, the vacuum sensors detect whether a vacuum pressure has been created within the expected vacuum grooves. If a vacuum pressure is detected, the testing or processing operation can begin and continue until completion 910. If a vacuum pressure is still not detected, a controller will continue to activate the blower and detect if a threshold vacuum pressure is created before testing. Upon completion of a manufacturing process, the object or wafer is released 912 by releasing the vacuum on the vacuum chuck.

FIGS. 10A-D illustrate other exemplary embodiments of a vacuum chuck 1004 and wafer 1002a-d arrangement. Specifically, the cross-section of a vacuum chuck 10004 is shown with different wafer sizes 1002a-d attached to the top surface 1016 of the vacuum chuck 1004. As previously discussed, the vacuum chuck 1000 includes concentric vacuum grooves 1006 with one vacuum hole 1008 located in each groove 1006.

Moreover, FIGS. 10A-D show vacuum lines within the vacuum chuck 1004 connecting the vacuum grooves 1006 to a manifold piece 1020. In one embodiment, the vacuum lines are manufactured to extend in a vertical and horizontal direction to connect a port to the side of the vacuum chuck 1000. In one embodiment, the vacuum lines that are associated with the first inner three grooves (three grooves closest to the center of the chuck) 1006a, 1006b, 1006c are grouped or ganged together to form a single vacuum line 1022. The grouping of the first 1006a, second 1006b, and third 1006c vacuum grooves into a single vacuum line 1022 has the distinct advantage of efficiently utilizing vacuum suction from the vacuum source 1014. In one embodiment, the first 1006a, second 1006b, and third 1006c vacuum lines are grouped together while the fourth 1006d, fifth 1006e, sixth 1006f, and seventh 1006g vacuum lines are independent from each other and separate from all other vacuum lines.

As previously shown in FIGS. 6A-C, a warped wafer is more likely to be warped closer to the edges of the wafer and thus still makes some contact in the center region of the vacuum chuck 1004 closest to the first three inner grooves 1006a-c. As a result, the pull down vacuum suction needed in the first three inner grooves 1006a-c is not as great as other grooves located closer to the outer edge (or outer circumference) of the vacuum chuck 1004.

Therefore, grouping the first three grooves 1006a-c into a single vacuum line 1022 may have a disadvantage of providing less vacuum suction per groove while providing the advantage of effectively rationing the amount of vacuum suction applied to specific grooves where extreme wafer warping is not as likely (as compared to outer vacuum grooves).

Figure 10A:
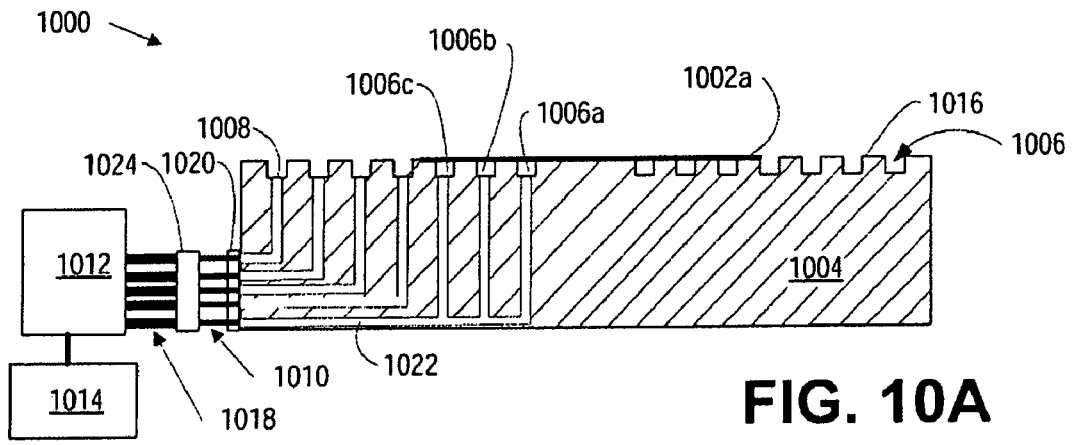
FIGS. 10A, 10B, 10C, and 10D show a cross-sectional side view of a vacuum chuck engaged with an object, according to another possible embodiment.

FIG. 10A further shows a valve arrangement 1012 connected with the vacuum source 1014 and connected with a first set of restrictions 1018. In one exemplary embodiment, the first set of restrictions 1018 includes five hoses or tubes each having a length of 36" and an inner diameter of ⅛" (0.125 inches). The hoses can be made oaf any known plastic, rubber, or flexible material. The first set of restrictions 1018 connect into a connecting piece 1024 which couples the first set of restrictions 1018 to a second set of restrictions 1010. In one embodiment, the second set of restrictions 1010 includes five hoses or tubes each having a length of 42" and an inner diameter of ¹⁄₁₆" (0.0625 inches). The second set of restrictions 1010 connect with the vacuum lines within the vacuum chuck 1004 through the manifold piece 1020. In one embodiment, the vacuum lines within the vacuum chuck 1004 are drilled passageways having an inner diameter of ⁹⁄₁₀" (0.9 inches).

FIG. 10A shows a four inch wafer 1002a that is fully engaged with the top surface 1016 of the vacuum chuck 1004 when all vacuum lines are opened by the valve 1012 allowing the vacuum source 1014 to provide vacuum suction to all the grooves 1006. In one exemplary embodiment, the vacuum source 1014 has a supply vacuum level of about 26 inHg. Furthermore, the vacuum grooves 1006d-g that are not located underneath the wafer 1002a do not create suction and thus have a pressure value of 0 inHg.

However, because of the first 1018 and second 1010 set of restrictions, a suction pressure of about 17 inHg is created in the first three groves 1006a-c enabling the wafer 1002a to be flattened on the top surface 1016. If the first 1018 and second 1010 set of restrictions were not present, the suction pressure within the first three grooves 1006a-c would be a value of 0 inHg due to the leakage of pressure through other vacuum grooves 1006d-g. Therefore, the presence of the restrictions 1018, 1010 is critical in the process of effectively flattening a warped wafer. In one embodiment, the restrictions are uniform across all the vacuum lines for efficient manufacturing and consistent performance reasons. It is understood that the above vacuum pressures described with respect to the four inch wafer 1002a may be identical to an example where an eight inch wafer (or smaller) is engaged with the first three grooves 1006a-c while leaking 100% through the remaining grooves. The presence of the restrictions 1018, 1010 ensures that the sealed grooves retain a relatively high vacuum pressure value compared to the other leaking grooves.

Figure 10B:
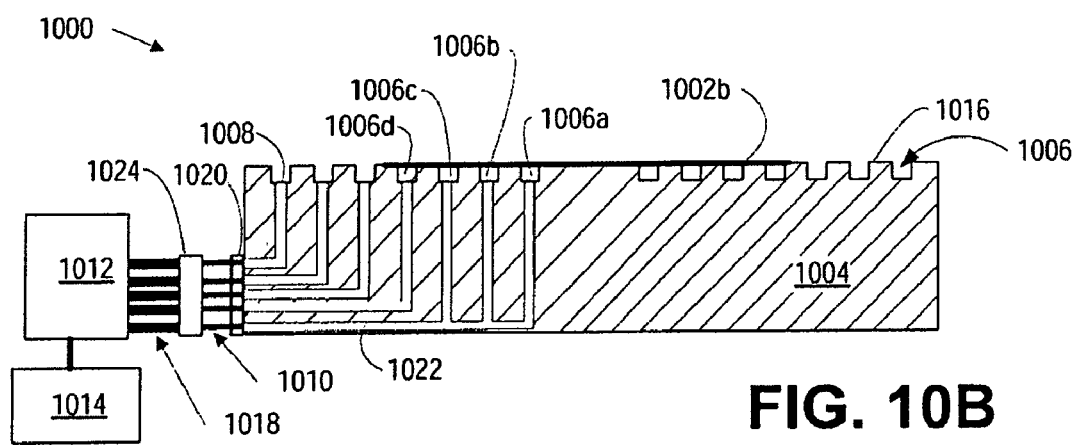

FIG. 10B shows the vacuum chuck 1004 being engaged with a five inch warped wafer 1002b that has been flattened on the top surface 1016. The first three vacuum grooves 1006a-c are covered by the wafer 1002b in addition to a fourth vacuum groove 1006d. The vacuum line associated with the fourth vacuum groove 1006d is independent from all other grooves 1006. In one embodiment, the vacuum pressure values within the grooves 1006 for a five inch wafer 1002b are about 19 inHg in the first three vacuum grooves 1006a-c and also about 19 inHg in the fourth vacuum groove 1006d. Again, the vacuum pressure of remaining exposed grooves is 0 inHg. It is understood that the above vacuum pressures described with respect to the five inch warped wafer 1002b may be identical to an example where an eight inch wafer (or smaller) is engaged with the first four grooves 1006a-d while having a 100% leaking through the fifth 1006e, sixth 1006f, and seventh 1006g groove. Again, the presence of the restrictions 1018, 1010 ensures that the sealed grooves retain a relatively high vacuum pressure value compared to the remaining leaking grooves.

Figure 10C:
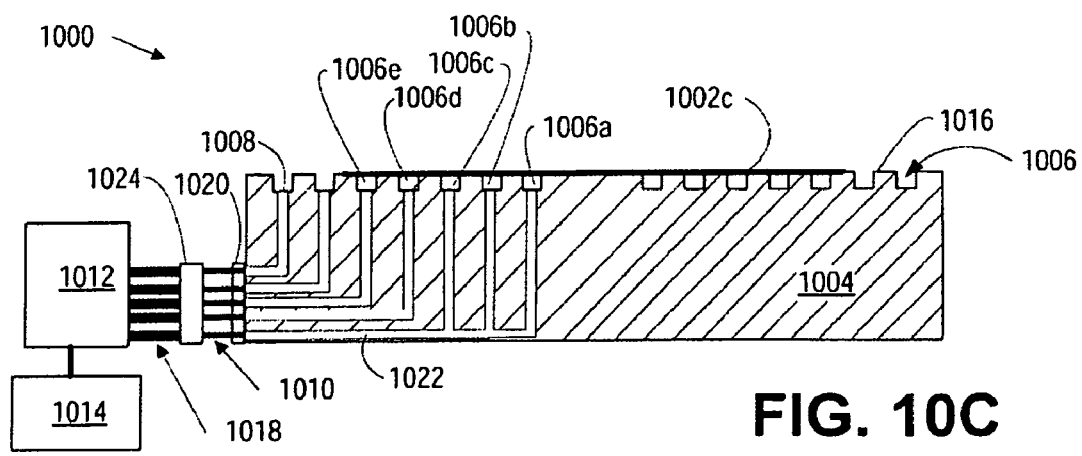

FIG. 10C illustrates the vacuum chuck 1004 being engaged with a six inch warped wafer 1002c that has been flattened on the top surface 1016. The first four vacuum grooves 1006a-d are covered by the wafer 1002c in addition to a fifth vacuum groove 1006e. The vacuum line associated with the fifth vacuum groove 1006e is independent from all other grooves 1006. In one embodiment, the vacuum pressure value within the first three grooves 1006a-c for a six inch wafer 1002c is about 20 inHg. In addition, the vacuum pressure value within the fourth groove 1006d is also about 20 inHg and the vacuum pressure value within the fifth groove 1006e is about 18 inHg. As previously noted, the pressure value within the fifth groove 1006e is slightly lower than the other grooves due to possible air leakage through the edge of the warped wafer 1002c as it is being held down on the vacuum chuck 1004. However, a pressure drop greater than 20% from the maximum vacuum pressure in a groove is prevented. In other words, at least 80% of the maximum vacuum pressure within a groove is maintained across all grooves, including leaking grooves.

In the current example, the pressure drop within the fifth groove 1006e is still at 90% of a maximum groove pressure ((18 inHg)/(20 inHg)×100=90%). In other words, only a 10% pressure drop is seen in the leaking fifth groove 1006e compared to the other grooves. Again, the same pressure values may apply to an example where an eight inch wafer is engaged with the first five grooves 1006a-e while having a 100% leak through the remaining sixth 1006f and seventh 1006g grooves.

Figure 10D:
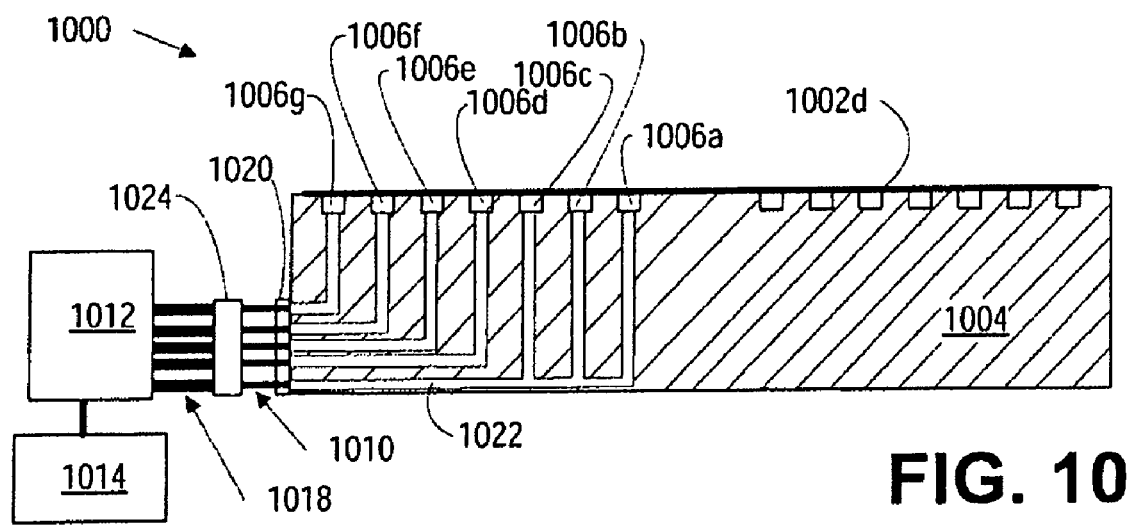

FIG. 10D shows the vacuum chuck 1004 being engaged with an eight inch warped wafer 1002d that has been flattened on the top surface 1016. The first five vacuum grooves 1006a-e are covered by the wafer 1002d in addition to a sixth 1006f and seventh 1006g vacuum groove. In one embodiment, the vacuum pressure within the first five vacuum grooves 1006a-e when the wafer 1002d is engaged is about 22 inHg. In addition, the vacuum pressure within the sixth 1006f and seventh 1006g vacuum grooves is about 20 inHg. Again, the lower pressure values in the outermost grooves may be associated with slight vacuum leakage between the edge of the wafer 1002d and the top surface 1016. However, the pressure within the sixth 1006f and seventh 1006g vacuum groove is still maintained at 91% of the maximum groove pressure ((20 inHg)/(22 inHg)×100=91%). In other words, only a 9% pressure drop is seen in the leaking sixth 1006f and seventh groove 1006g compared to the other grooves.

Although the above embodiments show certain size wafers being attached to the vacuum chuck 1004 when all vacuum lines are turned on, it is understood that in practical application the grooves 1006 not covered by a wafer may be turned off by the valve arrangement 1012 and control system 1100. In the above examples, if the grooves 1006 have no leakage or minimal leakage, a pressure of 25 inHg may be maintained across all grooves. The above examples are described to illustrate the ability of the restrictions to maintain a relatively high vacuum pressure within a sealed groove even when other grooves have 100% leakage.

Figure 11:
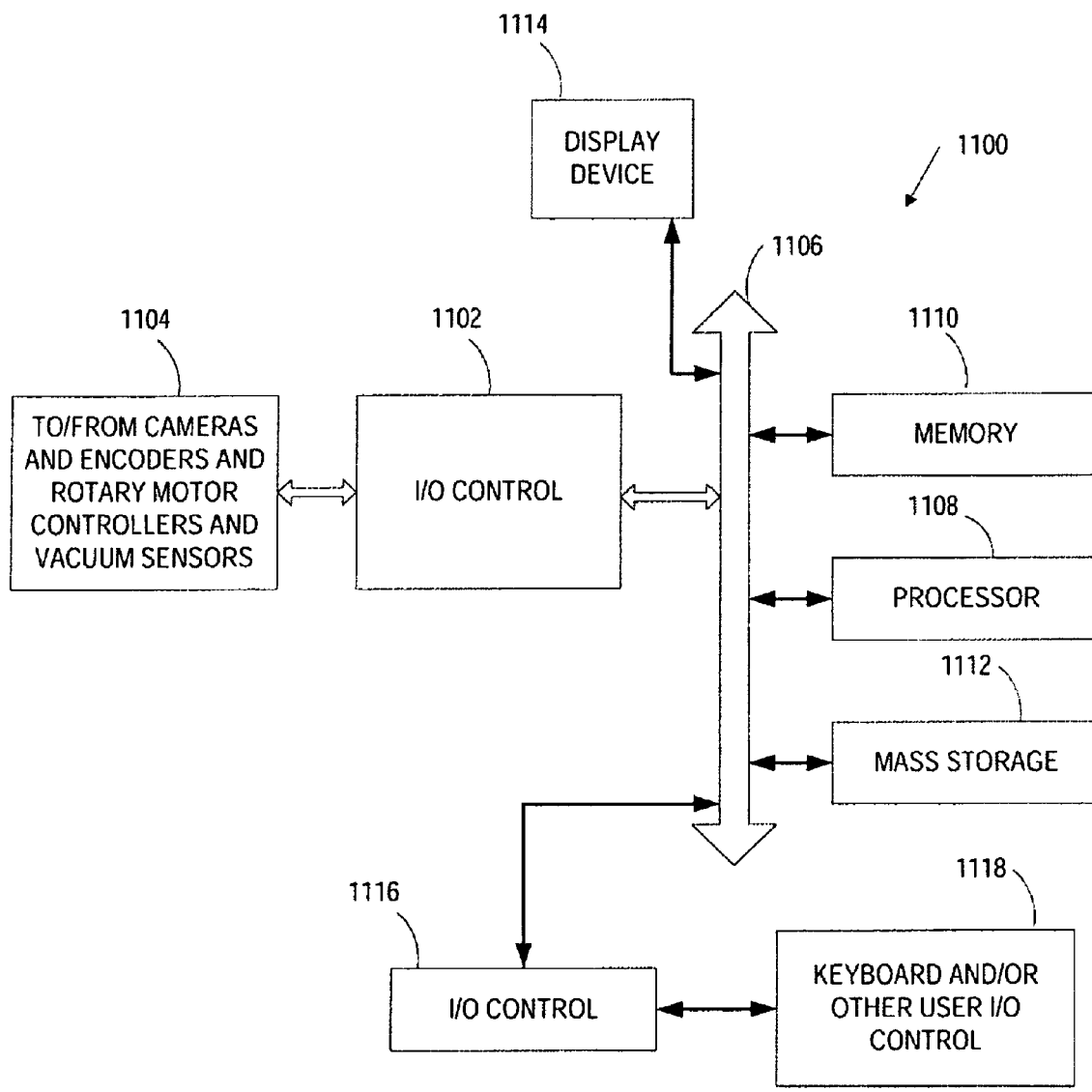
FIG. 11 shows an example of a computer system which may be used to control the system of the present invention.

FIG. 11 illustrates a control system 1100 according to one embodiment. The control system 1100 may be a general purpose or special purpose data processing system which is programmed (e.g. with a software program) or otherwise configured to perform one or more of the methods described herein. The vacuum chuck control system 1100 may include a processor(s) and a bus coupled to the processor(s) and a memory (e.g. RAM or flash memory, etc.) coupled to the bus and to the processor(s). The software program, if used, includes executable program instruction which when executed causes a data processing system to perform one or more of the methods described herein. The software program instructions may be stored in a machine readable storage medium such as a RAM, flash memory, or other storage media.

FIG. 11 further shows a digital processing system which may be a conventional general purpose computer system. This system 1100 may be used to control the vacuum chuck 500 and blower 706 by receiving inputs from the vacuum sensors and information from encoders or cameras that enable the effective vacuum suction of a flexible wafer on the vacuum chuck.

These inputs and outputs 1104 as shown in FIG. 11 are channeled through an input/output controller 1102 which provides data to and from the remainder of the processing system 1100. Typically, the processor 1108 is a general purpose microprocessor which retrieves executable computer program instructions from a mass storage device 1112, such as a hard disk, and which stores values in the memory 1110, which may be random access memory. Data is exchanged through this system over at least one bus 1106 which interconnects the various components of the system 1100. Also shown in FIG. 11, the system may include a display device 1114, such as a conventional CRT or LCD monitor, and may further include user I/O control input 1118 such as a keyboard which operates under control of a controller 1116.

The processor 1108 typically performs the computations described above in order to determine whether a wafer has been secured to the vacuum chuck, whether a blower should be activated, or which grooves should be activated depending on the size of the wafer or object being processed. Furthermore, the processor enables the vacuum suction and motor controls to operate in accordance with the methods of the preset invention, such as the method shown in FIG. 9. In this manner, a vacuum chuck system may be provided relatively inexpensively and yet providing a safe and effect vacuum chuck without causing damage to flexible wafers.

A key advantage of the present system is that the invention described above is faster and more effective in flattening a warped flexible wafer than self-propagation methods. Self-propagation techniques require complicated and expensive timing valves and control and logic to determine if a pressure differential is reached in one groove before activating another vacuum suction. Also, the use of complicated timing valves will introduce more variable and unpredictable restrictions into a system which may cause less air flow for the same amount of vacuum suction. In contrast, the present invention utilizes an "all on" system where all valves related to a specific wafer or object are initially opened to apply vacuum suction to all ports regardless of whether the wafer is known to be in position.

Another advantage of effectively maintaining a warped wafer to the vacuum chuck is that a "backside contact" may occur between the top surface of the vacuum chuck and the back or bottom side of the wafer to complete an electrical circuit for testing or manufacture processing.

In addition, another advantage is the manufacturing cost and considerations. The present invention provides the most cost effective and efficient solution to the problem of maintaining warped flexible wafers on a vacuum chuck. For example, the restrictions are all equally applied to the vacuum grooves and therefore allows an "all on" vacuum suction method which avoids complicated vacuum timing systems.

Thus, apparatuses and methods have been described for a vacuum chuck according to the present invention. Although the present invention has been described with reference to specific exemplary embodiments, it will be evident that various modifications and changes may be made to these embodiments without departing from the broader spirit and scope of the invention as set forth in the claims. Accordingly the specification and drawings are to be regarded in an illustrative rather than a restrictive manner.

In the foregoing specification, the invention has been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:
1. An apparatus comprising:
a chuck with a plurality of vacuum grooves on a surface, each single vacuum groove of the plurality of vacuum grooves having a single port connected with a single vacuum line coupled to a vacuum source, the single vacuum line not being shared with another groove, wherein a restriction is applied to the single vacuum line in order to isolate each single vacuum groove;

at least one sensor connected with the single vacuum line, the at least one sensor configured to determine when a pressurized vacuum region is created within the single vacuum groove that is associated with the single vacuum line; and a blower system configured to activate a blower to create a downward pressure in response to the at least one sensor.

2. The apparatus of claim 1, wherein the single port is within the single vacuum groove, the single vacuum groove being configured to be separate from other grooves to allow a pressurized vacuum region to be created when a vacuum suction is applied to engage a warped object to the surface of the chuck.

3. The apparatus of claim 2, wherein the single port of each single vacuum groove is arranged along a radial line extending from a center of the chuck to an outer radius of the chuck.

4. The apparatus of claim 1, wherein the restriction that is applied to the single vacuum line is a single hose having a hose length configured to isolate a sealed groove from a leaking groove within the plurality of vacuum grooves and wherein the single port is the only port to the vacuum source for its respective groove.

5. The apparatus of claim 4, wherein the single hose has a length of about 42 inches and an inner hose diameter of about 0.0625 inches to create a restriction between the plurality of vacuum grooves.

6. The apparatus of claim 1, wherein each single vacuum groove is capable of maintaining a sealed vacuum suction of at least 80% of a maximum vacuum suction within a groove.

7. The apparatus of claim 1, wherein the restriction that is applied to the single vacuum line is a needle valve.

8. The apparatus of claim 1, wherein the plurality of vacuum grooves are arranged in a plurality of concentric circular grooves across the surface of the chuck.

9. The apparatus of claim 8, wherein the plurality of concentric grooves are spaced about 1 inch in diameter apart from one another.

10. The apparatus of claim 9, wherein a first ring has a diameter of about 1 inch and a seventh ring has a diameter of about 7.2 inches.

11. A system comprising:

a base supported by a frame;

a stage supported by the base and configured to be moveable relative to the frame;

a chuck coupled to the stage and configured to support an object, the chuck having a plurality of vacuum grooves on a surface, each single vacuum groove of the plurality of vacuum grooves having a single port connected with a single vacuum line coupled to a vacuum source, the single vacuum line not being shared with another groove, wherein a restriction is applied to the single vacuum line in order to isolate each single vacuum groove;

at least one sensor coupled with the single vacuum line, the at least one sensor configured to determine when a pressurized vacuum region is created within the single vacuum groove that is associated with the single vacuum line; and a blower system configured to activate a blower to create a downward pressure on the object supported by the chuck in response to the at least one sensor.

12. The system of claim 11, wherein the restriction that is applied to the single vacuum line is a single hose having a hose length configured to isolate a sealed vacuum groove from a leaking groove within the plurality of vacuum grooves.

\* \* \* \* \*